(12) United States Patent
Manna et al.

(10) Patent No.: US 11,765,977 B2
(45) Date of Patent: Sep. 19, 2023

(54) TUNING THE PIEZOELECTRIC AND MECHANICAL PROPERTIES OF THE ALN SYSTEM VIA ALLOYING WITH YN AND BN

(71) Applicant: Colorado School of Mines, Golden, CO (US)

(72) Inventors: Sukriti Manna, Baltimore, MD (US); Geoff Brennecka, Lakewood, CO (US); Vladan Stevanovic, Arvada, CO (US); Cristian V. Ciobanu, Golden, CO (US)

(73) Assignee: Colorado School of Mines, Golden, CO (US)

( * ) Notice: Subject to any disclaimer, the term of this patent is extended or adjusted under 35 U.S.C. 154(b) by 247 days.

(21) Appl. No.: 16/158,826

(22) Filed: Oct. 12, 2018

(65) Prior Publication Data
US 2019/0123259 A1    Apr. 25, 2019

Related U.S. Application Data

(60) Provisional application No. 62/572,218, filed on Oct. 13, 2017.

(51) Int. Cl.
| | | |
|---|---|---|
| *C01B 21/06* | (2006.01) | |
| *C01B 21/072* | (2006.01) | |
| *H01L 41/187* | (2006.01) | |
| *H10N 30/853* | (2023.01) | |
| *C22C 1/10* | (2023.01) | |
| *C04B 35/583* | (2006.01) | |
| *C04B 35/581* | (2006.01) | |
| *C04B 35/58* | (2006.01) | |
| *H10N 30/095* | (2023.01) | |
| *C22C 29/16* | (2006.01) | |

(52) U.S. Cl.
CPC ....... *H10N 30/853* (2023.02); *C01B 21/0602* (2013.01); *C04B 35/58* (2013.01); *C04B 35/581* (2013.01); *C04B 35/583* (2013.01); *C22C 1/10* (2013.01); *H10N 30/095* (2023.02); *C01P 2002/30* (2013.01); *C01P 2006/40* (2013.01); *C04B 2235/386* (2013.01); *C04B 2235/3852* (2013.01); *C04B 2235/3865* (2013.01); *C04B 2235/76* (2013.01); *C22C 29/16* (2013.01); *C22C 2200/00* (2013.01)

(58) Field of Classification Search
CPC ... C01B 21/00; C01B 21/072; C01B 21/0602; H01L 41/187
See application file for complete search history.

(56) References Cited

U.S. PATENT DOCUMENTS

2019/0013458 A1*  1/2019  Hill ................... H03H 9/02031

OTHER PUBLICATIONS

Fatmi. Theoretical studies of structural, elastic, electronic and lattice dynamicproperties of AlxYyB1xyN quaternary alloys. Physica B 406 (2011) 2521-2527.*

(Continued)

*Primary Examiner* — Matthew E. Hoban
(74) *Attorney, Agent, or Firm* — Dorsey & Whitney LLP

(57) ABSTRACT

Methods and materials are disclosed for simultaneously optimizing both the piezoelectric and mechanical properties of wurtzite piezoelectric materials based on the AlN wurtzite and alloyed with one or two end-members from the set BN, YN, CrN, and ScN.

20 Claims, 13 Drawing Sheets

(56) References Cited

OTHER PUBLICATIONS

Yokoyama. Highly Piezoelectric Co-Doped AlN Thin Films for Wideband FBAR Applications. IEEE Transactions On Ultrasonics, Ferroelectrics, and Frequency Control, vol. 62, No. 6, Jun. 2015 (Year: 2015).*
Barsukova, et al., Polyoxopalladates Encapsulating Yttrium and Lanthanide Ions,[Xiiipdii12 (Asph) 8o32] 5-(X=Y, Pr, Nd, Sm, Eu, Gd, Tb, Dy, Ho, Er, Tm, Yb, Lu), Chemistry—A European Journal 16, 9076-9085 (2010).
Caro, et al., Piezoelectric Coefficients and Spontaneous Polarization of Scaln, Journal of Physics: Condensed Matter 27, 245901 (2015).
Egerton, et al., Piezoelectric and Dielectric Properties of Ceramics in the System Potassium—Sodium Niobate, Journal of the American Ceramic Society, vol. 42, pp. 438-442, (1959).
Kano, et al., Enhancement of Piezoelectric Response in Scandium Aluminum Nitride Alloy Thin Films Prepared by Dual Reactive Cosputtering, Advanced Materials 21, 593-596 (2009).
Kim, et al., Aspect Ratio Dependence of Electromechanical Coupling Coefficient of Piezoelectric Resonators, Applied Physics Letters 87, 132901 (2005).
Kim, et al., Comparison of Mems Pzt Cantilevers Based on D31 and D33 Modes for Vibration Energy Harvesting, Journal of microelectromechanical systems, vol. 22, pp. 26-33, (2013).
Kresse, et al., Efficiency of Ab-Initio Total Energy Calculations for Metals and Semiconductors Using a Plane-Wave Basis Set, Computational Materials Science, vol. 6, pp. 15-50, (1996).
Kresse, et al., From Ultrasoft Pseudopotentials to the Projector Augmented-Wave Method, Physical Review B, vol. 59, 1758 (1999).
Li, et al., Determining the Elastic Modulus and Hardness of an Ultrathin Film on a Substrate Using Nanoindentation, J. Water. Res., vol. 24, No. 3, pp. 1114-1126, 2009.
Mayrhofer, et al., Microstructure and Piezoelectric Response of Yxal 1—Xn Thin Films, Acta Materialia, vol. 100, pp. 81-89, (2015).
Monkhorst, et al., Special Points for Brillouin-Zone Integrations, Physical Review B, vol. 13, pp. 5188-5192, (1976).
Narayanan, et al., Elastic Constants of B-Eucryptite Studied by Density Functional Theory, Physical Review B, vol. 81, 104106(2010).
Pang, et al., A Flexible and Highly Sensitive Strain-Gauge Sensor Using Reversible Interlocking of Nanofibres,Nature materials, vol. 11, pp. 795-801 (2012).
Park, et al., Flexible and Stretchable Piezoelectric Sensor with Thickness-Tunable Configuration of Electrospun Nanofiber Mat and Elastomeric Substrates, ACS Applied Materials & Interfaces 8, 24773-2478 (2016).
Perdew, et al., Generalized Gradient Approximation Made Simple, Physical review letters, vol. 77, pp. 3865-3868, (1996).
Piazza, et al., Piezoelectric Aluminum Nitride Thin Films for Microelectromechanical Systems, MRS bulletin 37, 1051-1061 (2012).
Rogers, et al., Materials and Mechanics for Stretchable Electronics, Science vol. 327, pp. 1603-1607, (2010).
Syms, et al., Mechanical Stability of a Latching Mems Variable Optical Attenuator, Journal of microelectromechanical systems vol. 14, pp. 529-538, (2005).
Tasnadi, et al., Significant Configurational Dependence of the Electromechanical Coupling Constant of B0.125al0.875n, Applied Physics Letters 94 (2009).
Tasnádi, et al., Origin of the Anomalous Piezoelectric Response in Wurtzite Sc X Al 1—X N Alloys, Physical review letters 104, 137601 (2010).
Tholander, et al., Ab Initio Calculations and Experimental Study of Piezoelectric Y X in 1—X N Thin Films Deposited Using Reactive Magnetron Sputter Epitaxy, Acta Materialia, vol. 105, pp. 199-206 (2016).
Tholander, et al., vol. Matching Condition to Establish the Enhanced Piezoelectricity in Temary (Sc,Y)(0.5)(Al, Ga,in)(0.5)N Alloys, Physical Review B 87 (2013).
Trolier-McKinstry, et al., Thin Film Piezoelectrics for Mems, Journal of Electroceramics, vol. 12, pp. 7-17, (2004).
Uchino, K., Materials Issues in Design and Performance of Piezoelectric Actuators: An Overview, Acta Materialia vol. 46, pp. 3745-3753, (1998).
Uchino, Kenji, Piezoelectric Ultrasonic Motors: Overview, Smart materials and structures 7, 273 (1998).
Van De Walle, et al., Efficient Stochastic Generation of Special Quasirandom Structures, Calphad, vol. 42, pp. 13-18 (2013).
Vanderbilt, David, Berry-Phase Theory of Proper Piezoelectric Response, Journal of Physics and Chemistry of Solids 61, 147-151 (2000).
Wang, et al., Electromechanical Coupling and Output Efficiency of Piezoelectric Bending Actuators, IEEE transactions on ultrasonics, ferroelectrics, and frequency control, vol. 46, pp. 638-646, (1999).
Wingqvist, Gunilla, Thin-Film Electro-Acoustic Sensors Based on AlN and Its Alloys: Possibilities and Limitations, Microsystem technologies vol. 18, pp. 1213-1223, (2012).
Yang, et al., Analysis of Mechanical and Electrical Damages in Piezoelectric Ceramics. (INTECH Open Access Publisher, 2010).
Yang, et al., First-principles calculation of the effects of Li-doping on the structure and piezoelectricity of (K0.5Na0.5) NbO3 lead-free ceramics, vol. 18, pp. 7702-7706, (2016).
Yu, et al., The effect of substrate on the elastic properties of films determined by the indentation test—axisymmetric boussinesq problem, J. Mech. Phys. Solids, vol. 38, No. 6, pp. 745-764, 1990.
Zhang, et al., Effects of Sputtering Atmosphere on the Properties of C-Plane Scaln Thin Films Prepared on Sapphire Substrate, Journal of Materials Science: Materials in Electronics 26, 472-478 (2015).
Zukauskaite, et al., Yxal1-Xn Thin Films, Journal of Physics D-Applied Physics 45 (2012).

* cited by examiner

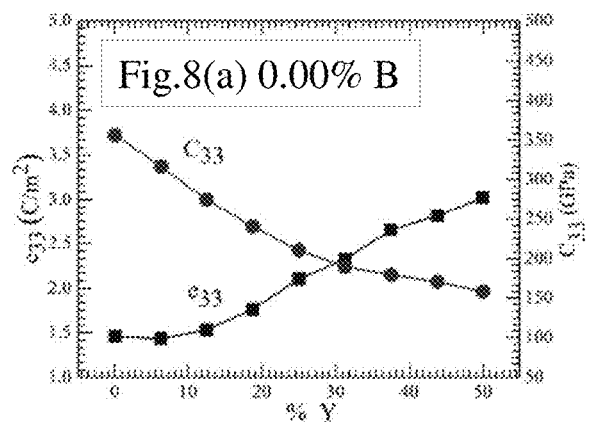
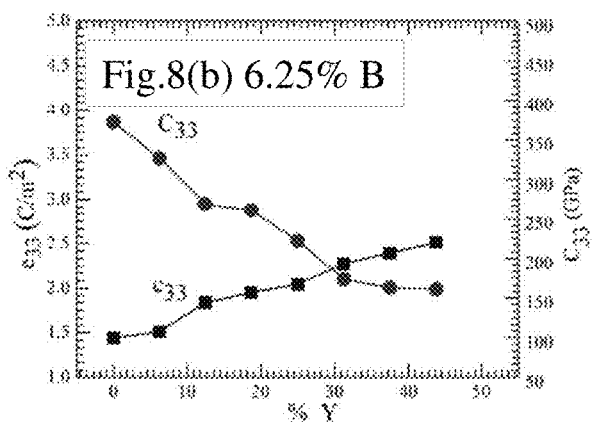
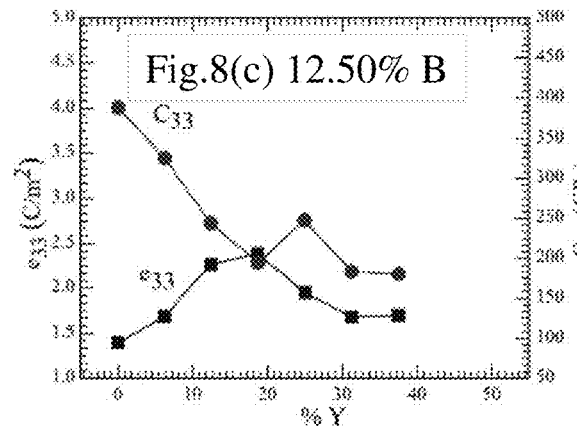
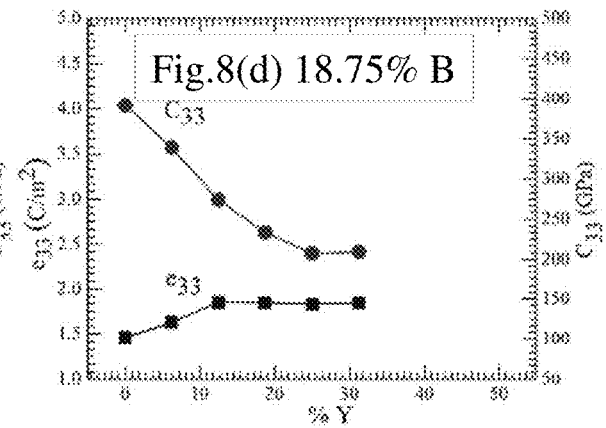

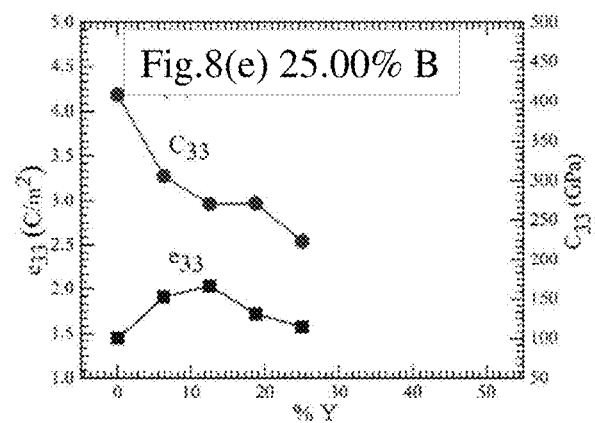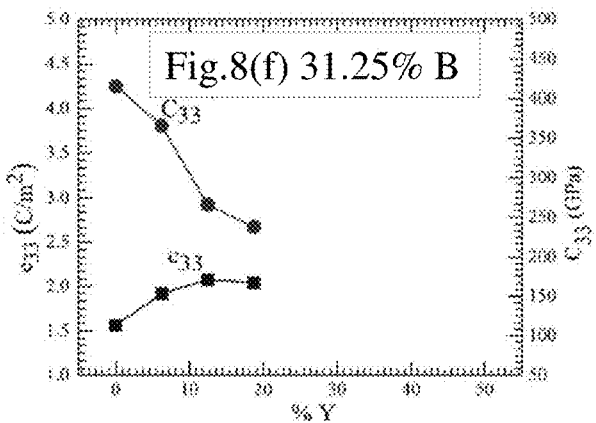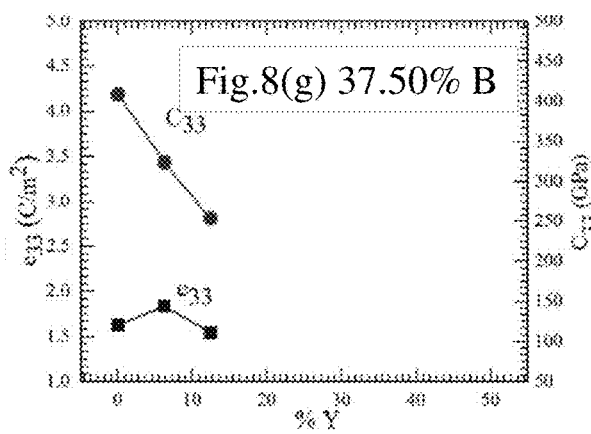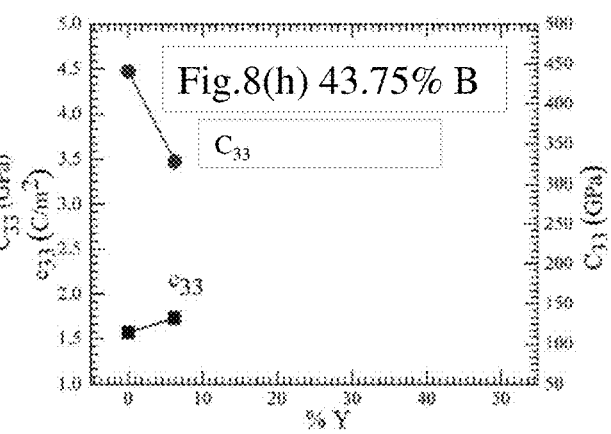

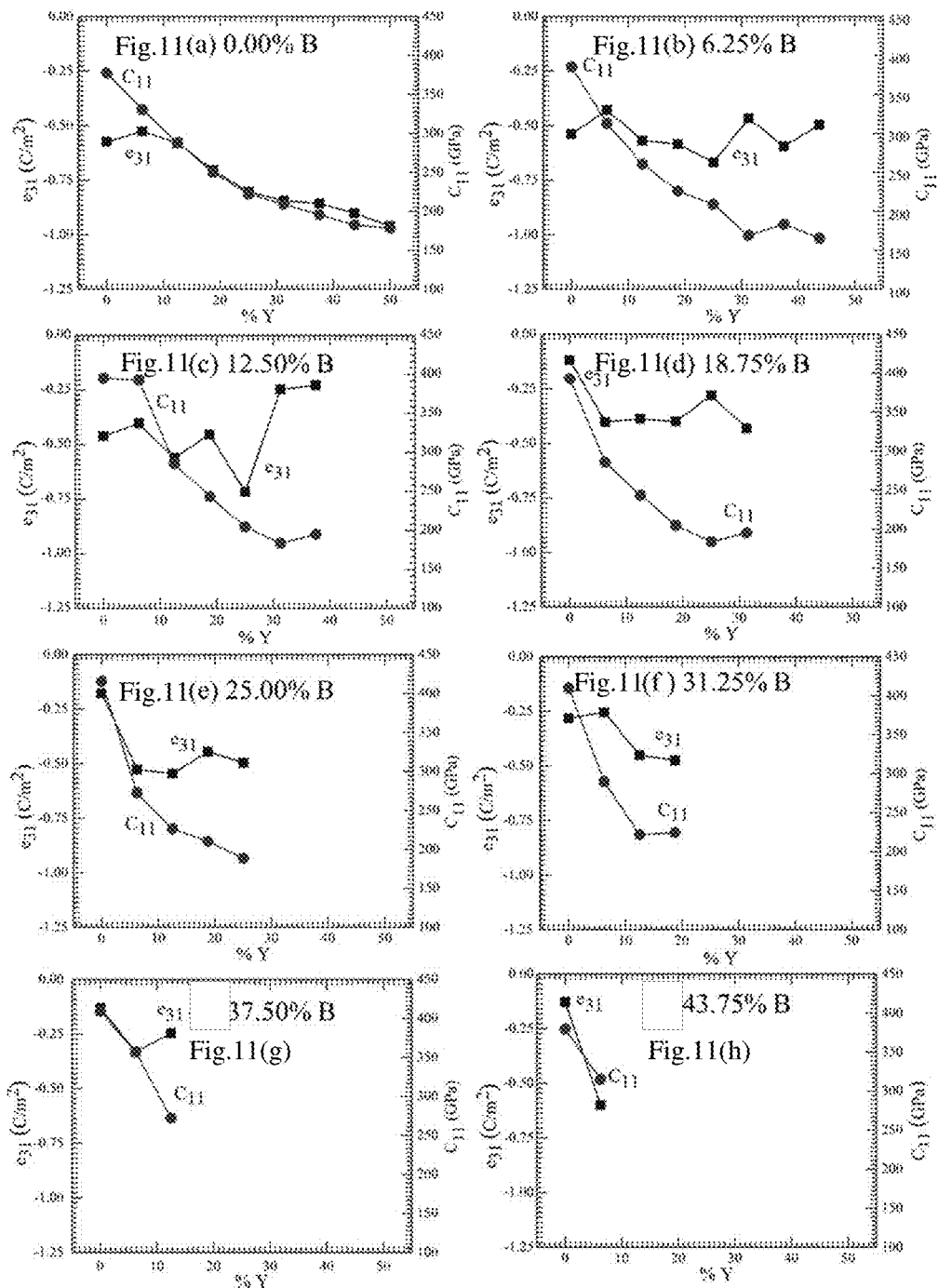
Fig. 11 Piezoelectric coefficient $e_{31}$ and elastic modulus $C_{11}$ as functions of Y and B concentrations.

TUNING THE PIEZOELECTRIC AND MECHANICAL PROPERTIES OF THE ALN SYSTEM VIA ALLOYING WITH YN AND BN

CROSS REFERENCE TO RELATED APPLICATIONS

This application claims benefit of priority pursuant to 35 U.S.C. § 119(e) of U.S. provisional patent application No. 62/572,218 filed 13 Oct. 2017, which is hereby incorporated herein by reference in its entirety.

GOVERNMENT LICENSE RIGHTS

This invention was made with Government support under Grant No. DMR-1534503 awarded by the National Science Foundation. The Government has certain rights in the invention.

FIELD

The disclosed materials, processes, methods, devices, and systems are directed to piezoelectric materials with tunable properties.

BACKGROUND

Recent technological advances in microelectromechanical systems (MEMS) require materials to be more efficiently designed, often leading to optimization of more than one property. An electromechanical (piezoelectric) material requires the best piezoelectric coefficient, while materials for damping high mechanical loads require high stiffness moduli. A high stiffness value is also associated with thermal stability, enabling the use of these materials over a large temperature range. Pseudo-binary alloys, i.e. solid solutions between two compounds, have been extensively investigated for use in electromechanical applications. Most of these alloys have large miscibility gaps, which makes them less appealing for applications where mechanical stability is a figure of merit. Current processing techniques allow for fabricating pseudo-binary alloys in which one can seek a given functionality by, e.g., changing composition so as to optimize piezoelectric coefficients, stiffness, electromechanical coupling constants, or bandgap to desired values. However, achieving optimal or desired values for more than one such property is challenging since optimizing one property often changes another towards undesirable values.

With the discovery of the anomalously large increase in the piezoelectric moduli of wurtzite AlN (aluminum nitride) when alloyed with ScN (scandium nitride) or YN (yttrium nitride), AlN-based alloys have received a lot of attention as materials for improved telecommunications, sensors, and surface acoustic wave devices. The origin of the enhanced piezoelectricity was revealed to be an intrinsic effect of alloying, as opposed to textural or microstructural effects, with the possibility that controlling the piezoelectric enhancement might be possible mainly by increasing composition of YN or ScN. However, such alloying softens the material significantly, which actually makes the material less attractive for resonant applications for which $k^2Q$ is a common figure of merit, where k is an electromechanical coupling coefficient and Q is a quality factor that is inversely proportional to mechanical dissipation.

Co-alloying with BN, YN, and CrN (chromium nitride) increases the stiffness of mechanical resonators that use AlN based piezoelectric materials. For many of the applications that employ AlN-based materials in resonator applications (e.g., filters for wireless communications and other MEMS devices, currently ~half of the >$10B annual market, >12% CAGR), the relevant figure(s) of merit depend strongly not only on the electromechanical conversion coefficients ($k^2$) and the various piezoelectric coefficients (d and e tensors), but also the mechanical quality factor which is directly related to mechanical stiffness. Prior efforts have improved piezoelectric coefficients and in some cases $k^2$ values significantly, but at the expense of stiffness, essentially getting greater field-induced strain by softening the material, resulting in devices that are actually worse for resonators than their unmodified counterparts.

What is needed is the ability to control the mechanical properties as well as piezoelectric properties. Disclosed herein is the use of alloying with other species to achieve the desired control and tunability. This increase in degrees of freedom may help create a framework in which advanced materials can be optimized for multiple functionalities. Disclosed herein is a piezoelectric system wherein alloying with more than one compound enables tuning two properties, specifically, the piezoelectric coefficient and the mechanical stiffness.

SUMMARY

Disclosed herein is a material having a piezoelectric property, comprising a wurtzite crystal structure compound wherein the wurtzite crystal structure compound is selected from the group consisting of aluminum nitride and indium nitride, further comprising a first alloying element, and a second alloying element.

Disclosed herein is a method of fabricating a material having a piezoelectric property, comprising, alloying a wurtzite crystal structure compound with a first alloying element and a second alloying element, wherein the wurtzite crystal structure compound is selected from the group consisting of aluminum nitride and indium nitride.

Disclosed herein is a method of altering an elastic modulus of a material having a piezoelectric property, comprising depositing a film of the material on a substrate.

In some embodiments, adding BN to YN-alloyed AlN, or to CrN-alloyed AlN helps mitigate the elastic softening while also improving strain response of the disclosed materials. This may, in turn, lead to a net gain for piezoelectric devices and resonator applications.

This Summary is provided to introduce a selection of concepts in a simplified form that are further described below in the Detailed Description. This Summary is not intended to identify key features or essential features of the claimed subject matter, nor is it intended to limit the scope of the claimed subject matter. A more extensive presentation of features, details, utilities, and advantages of the present invention as defined in the claims is provided in the following written description of various embodiments of the invention, and illustrated in the accompanying drawings.

BRIEF DESCRIPTION OF THE DRAWINGS

FIG. 8(a) is an illustration of the piezoelectric charge coefficient and elastic modulus of a wurtzite crystal as a function of yttrium concentration with 0% boron, according to some embodiments.

FIG. 8(b) is an illustration of the piezoelectric charge coefficient and elastic modulus of a wurtzite crystal as a function of yttrium concentration with 6.25% boron, according to some embodiments.

FIG. 8(c) is an illustration of the piezoelectric charge coefficient and elastic modulus of a wurtzite crystal as a function of yttrium concentration with 12.50% boron, according to some embodiments.

FIG. 8(d) is an illustration of the piezoelectric charge coefficient and elastic modulus of a wurtzite crystal as a function of yttrium concentration with 18.75% boron, according to some embodiments.

FIG. 8(e) is an illustration of the piezoelectric charge coefficient and elastic modulus of a wurtzite crystal as a function of yttrium concentration with 25% boron, according to some embodiments.

FIG. 8(f) is an illustration of the piezoelectric charge coefficient and elastic modulus of a wurtzite crystal as a function of yttrium concentration with 31.25% boron, according to some embodiments.

FIG. 8(g) is an illustration of the piezoelectric charge coefficient and elastic modulus of a wurtzite crystal as a function of yttrium concentration with 37.50% boron, according to some embodiments.

FIG. 8(h) is an illustration of the piezoelectric charge coefficient and elastic modulus of a wurtzite crystal as a function of yttrium concentration with 43.75% boron, according to some embodiments.

FIG. 11(a) is an illustration of piezoelectric coefficient $e_{31}$ and elastic modulus $C_{11}$ as function of Y concentration at 0% B, according to some embodiments.

FIG. 11(b) is an illustration of piezoelectric coefficient $e_{31}$ and elastic modulus $C_{11}$ as function of Y concentration at 6.25% B, according to some embodiments.

FIG. 11(c) is an illustration of piezoelectric coefficient $e_{31}$ and elastic modulus $C_{11}$ as function of Y concentration at 12.5% B, according to some embodiments.

FIG. 11(d) is an illustration of piezoelectric coefficient $e_{31}$ and elastic modulus $C_{11}$ as function of Y concentration at 18.75% B, according to some embodiments.

FIG. 11(e) is an illustration of piezoelectric coefficient $e_{31}$ and elastic modulus $C_{11}$ as function of Y concentration at 25% B, according to some embodiments.

FIG. 11(f) is an illustration of piezoelectric coefficient $e_{31}$ and elastic modulus $C_{11}$ as function of Y concentration at 31.25% B, according to some embodiments.

FIG. 11(g) is an illustration of piezoelectric coefficient $e_{31}$ and elastic modulus $C_{11}$ as function of Y concentration at 37.5% B, according to some embodiments.

FIG. 11(h) is an illustration of piezoelectric coefficient $e_{31}$ and elastic modulus $C_{11}$ as function of Y concentration at 43.75% B, according to some embodiments.

Figure 1:
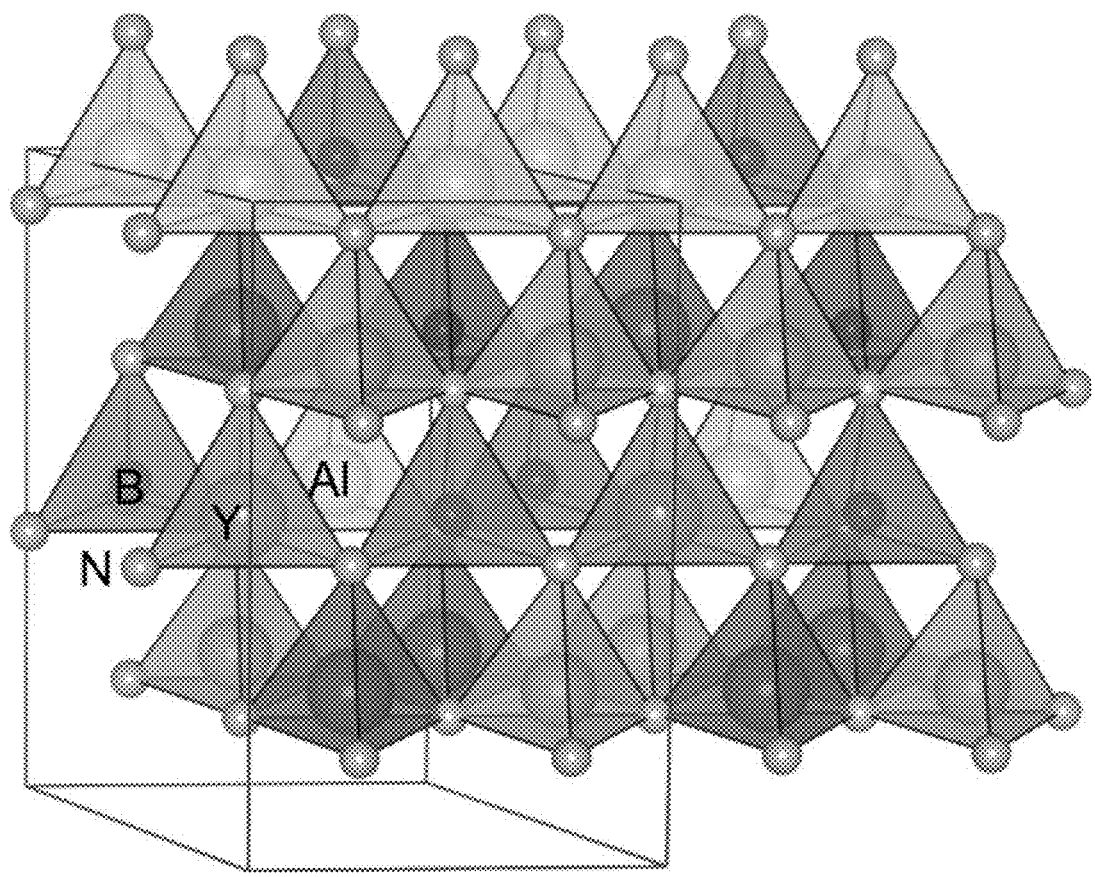
FIG. 1 is an illustration of one embodiment of a wurtzite lattice in which the parent structure is aluminum nitride, in which aluminum is substituted with yttrium and boron in certain places.

Table 1 is a comparison between the properties of Al—Y—B nitrides, according to some embodiments of this disclosure, compared to those of three commercial piezoelectric materials.

DETAILED DESCRIPTION

The present disclosure is generally directed to piezoelectric materials and compositions thereof having enhanced properties. In addition, methods of making said materials are disclosed, wherein the disclosed methods may allow for simultaneously controlling (or tuning) the mechanical and piezoelectric properties of the materials. In many embodiments, the materials' properties may be tuned to specific characteristics of a given device or system incorporating the material. In many embodiments, the piezoelectric materials' properties may be selected from mechanical stiffness and piezoelectric response to applied electric fields.

Also disclosed are methods and processes of making the disclosed materials and compositions. In some cases, the disclosed nitride materials are grown as crystals comprising one or more cations selected from the set of aluminum, indium, boron, chromium, yttrium, and scandium. Reference herein to elements may include one or more single elements; compounds, ceramics, or crystals of one or more elements bound by any type of chemical or physical bond, including but not limited to, ionic bonds, covalent bonds, or metallic bonds.

Also disclosed are films comprising the disclosed material. In many embodiments, the disclosed film may have one or more significant piezoelectric coefficients.

Recent advances in microelectromechanical systems (MEMS) often require multifunctional materials, which are designed so as to optimize more than one property. Using density functional theory calculations for alloyed nitride systems, co-alloying a piezoelectric material (AlN) with different nitrides is shown to help tune both its piezoelectric and mechanical properties simultaneously. Wurtzite AlN—YN alloys display increased piezoelectric response with YN concentration, accompanied by mechanical softening along the crystallographic c direction. Both effects increase the electromechanical coupling coefficients relevant for transducers and actuators. Resonator applications, however, benefit from enhanced stiffness, thus leading to the need to decouple the increased piezoelectric response from a softened lattice. Disclosed herein is the co-alloying of AlN with YN and BN (boron nitride) to aid in improving elastic properties while retaining most of the piezoelectric enhancements from YN alloying. Disclosed herein is the alloying of AlN with CrN to in the form of wurtzite crystal structure to aid in enhancements of the piezoelectric coefficient. The disclosed materials, compositions, devices, methods, and systems may lead to new avenues for tuning the design properties of piezoelectrics through composition-property maps.

Disclosed herein are AlN—YN alloys wherein further alloying with BN is shown to increase the elastic constants of the material to provide for novel piezoelectric designs based on property tuning, in part, through precise control YN and BN compositions. The choice for YN is motivated by the scarcity of literature reports on AlN—YN alloys, and because Y may be a less expensive alternative for Sc. While the elastic stiffening of AlN—YN upon alloying with BN may be enabled by the presence of shorter and stiffer B—N bonds, the effect of alloying with BN on the piezoelectric properties is presently unknown.

Described herein is the use of density functional theory (DFT) to show that the presence of BN, by itself, indeed leads to increases in the relevant elastic constant $C_{33}$. Surprisingly, Applicants show that the piezoelectric coefficient $e_{33}$ is not changed significantly. Furthermore, Applicants also identified additional enhancements due to the combined effect of alloying with YN and BN on the properties of the AlN system for total alloying concentrations up to 50%. Specifically, it has been surprisingly shown that addition of BN to AlN—YN alloys counters to some extent the piezoelectric enhancement obtained via YN alloying, but increases the elastic modulus. Overall, Applicants show that alloying of AlN with BN and YN leads to a high degree of control (tunability) of the piezoelectric and elastic properties of the resulting alloy, and therefore the coupling coefficients and various figures of merit commonly used in piezoelectric device design.

Piezoelectric materials have special properties that make them useful for a variety of applications. In some cases, piezoelectric materials can be used to generate a voltage (electrical potential) when strained. Alternatively, when a voltage is applied to a piezoelectric crystal, the crystal may react with mechanical energy (i.e., growing or shrinking). Piezoelectric materials may be used in and for a variety of purposes, such as energy harvesting, pressure sensors, accelerometers, gyroscopes, oscillators, and resonators.

One class of piezoelectric materials includes crystals with a wurtzite crystal structure. Wurtzite crystal structure is named after the mineral wurtzite, which is a binary crystal having a hexagonal crystal system. See, for example FIG. 1. One exemplary piezoelectric material having the wurtzite crystal structure is aluminum nitride (AlN). AlN materials are used in many applications as piezoelectric materials, however, their piezoelectric coefficient may be enhanced via alloying with other nitrides such as chromium nitride (CrN), scandium nitride (ScN), or yttrium nitride (YN). In many cases, however, doing so makes the materials softer, which is not desirable for resonators and other applications.

In some embodiments, methods and processes are disclosed for simultaneous control, selection, or tuning of the piezoelectric coefficient, while also improving—or minimizing the loss of—mechanical stiffness. In many embodiments, the disclosed material is AlN alloyed with CrN, ScN, and/or YN) and possess a wurtzite crystal systems. Use of both YN and BN for alloying with AlN may offer intrinsic, simultaneous control over the mechanical and piezoelectric properties of the disclosed crystal system. This combination of properties is desirable for many piezoelectric devices and micro-electromechanical systems including, without limitation, oscillators, acoustic resonators, energy harvesting devices, pressure sensors, accelerometers, band-pass filters, and gyroscopes. In some embodiments, elements other than Y or B may be included in the wurtzite crystal, for example ions, such as cations, for example trivalent ions, or ions that behave as trivalent.

In many cases, wurtzite crystal systems may have a hexagonal cell structure. As such, the crystal's unit cell may be described with just two lattice constants, a and c (because two sides are of equal length). In one embodiment, the disclosed material is a wurtzite crystal system comprising AlN, where one or more Al atoms are substituted with Y and B. In another embodiment, the disclosed material is a wurtzite crystal system comprising AlN, where one or more Al atoms are substituted with Cr. Other suitable elements may also be substituted into the lattice to aid in tuning the piezoelectric or mechanical properties of the material.

Mechanical Properties

The mechanical properties of the disclosed material may be tuned by varying the concentration of one or more elements in the material. In many cases, mechanical properties of the disclosed material may correlate with one or more crystal lattice constants. Thus, for example, increasing quantities of yttrium, boron, and/or chromium added to the disclosed AlN material may be used to affect the lattice constant of the disclosed material relative to that of an AlN crystal lattice. In some embodiments, changes to the crystal's lattice constants a and c may result in changes to both the mechanical and piezoelectric properties of a material comprising the crystal. In some embodiments, increasing the concentration of yttrium, may result in increasing the length of the crystal in the a-axis direction. In other embodiments, increasing the concentration of boron may result in decreasing the length of the crystal in the a direction.

In some embodiments, increasing quantities of yttrium, boron and chromium may affect the lattice constant of the parent AlN crystal's c lattice constant. In these embodiments, the length of the crystal lattice in the c-axis direction may be increased by increasing the concentration of yttrium or chromium. In these embodiments, increasing the c-axis length may occur up to about 38% yttrium concentration, and up to about 30% chromium. In other embodiments, increasing the concentration of boron may decrease the length of the crystal in the c direction.

Previous work has developed various techniques to determine elastic modulus from thin films. The elastic modulus can be extracted from the resonance frequency of cantilever beams that are fabricated out of the thin film of interest, but this technique requires multiple film deposition, etching, and lithography procedures and optimization thereof. In contrast, instrumented indentation presents a nearly preparation-free testing method for thin films deposited on a substrate making it more suitable for rapid evaluation of elastic modulus in films fabricated via combinatorial deposition in order to cover a large composition range over a single sample library. However, one important complication arises for testing thin films: when the size of the stress field induced by indentation approaches the film thickness, the measurement of the reduced elastic modulus is invariably influenced by the substrate. Recently, these limitations have been overcome by Li and Vlassak, who introduced a numerical calculation method based on an analytical model of the contact mechanics of a laminated film, showing that the impact of the substrate could be effectively removed from the data for a wide range of elastic dissimilarities and film thicknesses. The present work improves upon the method of Li and Vlassak by allowing for customization of optimization parameters and the utilization of parallel processing on a high-performance computing cluster.

Piezoelectric Properties

The piezoelectric charge coefficient $e_{33}$ and Young's (elastic) modulus $C_{33}$ may be selected by varying the concentrations of yttrium, boron, and/or chromium within an AlN wurtzite lattice. In many embodiments, the piezoelectric charge coefficient $e_{33}$ is a useful measure of the performance of the piezoelectric properties of a material. Specifically, it is a measure of the ratio of the electric field generated to the stress applied to the crystal, or the ratio of the strain in the piezoelectric element to the electric displacement applied. $C_{33}$ is a measure of the Young's (elastic) modulus of a piezoelectric element. Specifically, it is the ratio of stress applied to a piezoelectric element to the induced strain. The "33" subscript indicates that the electric field and the mechanical stress are both applied along the polarization axis of the piezoelectric element; typically, but not exclusively, this is the crystallographic c-axis.

In some embodiments, increasing the YN content in $Al_{1-x}Y_xN$ may increase the piezoelectric coefficient $e_{33}$ but decrease the elastic modulus $C_{33}$. In other embodiments, increasing the CrN content in $Al_{1-x}Cr_xN$ increases the piezoelectric coefficient $e_{33}$ but decreases the elastic modulus $C_{33}$. On the other hand, increasing the concentration of BN in $Al_{1-y}B_yN$ may have a small effect on the piezoelectric coefficient, but may increase the elastic modulus, up to 50% boron. Thus, in various embodiments disclosed, and their equivalents, co-alloying with YN and BN and/or CrN and BN may lead to simultaneous increases of the piezoelectric coefficient with respect to AlN and increased stiffness with respect to Al—Y—N AlN.

Deposition of AlN—YN films may result in a strain in the lattice. The strain may result from, without wishing to be limited by theory, mismatch with the substrate, changing film texture with alloy concentration, or insufficient annealing. In some embodiments, DFT calculations may be performed to help assess the strain's effect on the piezoelectric coefficient. These calculations may be performed for cases where the strain is applied in plane (along the a and b directions) or out of plane (along the c direction). In some embodiments, alloying with Y may result in $e_{33}$ increasing up to about 3.75 C/m² (i.e., 2.5 times that of pure AlN) by applying 2% tension along the a axis, or, alternatively, by applying 2% compression along the c axis. In some embodiments, greater Y concentrations and/or higher tension or compression forces may result in greater $e_{33}$. In some embodiments, the effects of strain along c and a directions may partially cancel each other, and thus not affect the piezoelectric coefficient significantly.

The piezoelectric properties of the disclosed materials may be selected or tuned by varying the ratio of aluminum, boron, chromium, and yttrium in an AlYBN alloy. In many embodiments, the material is a wurtzite structure, and together Y and N comprise less than 72% of the material. In some embodiments, the concentration of yttrium and boron, relative to aluminum is less than about 50%. In most embodiments, the percent yttrium is greater than about 0% and less than about 50%, and the percent of boron is greater than about 0% and less than about 50%. In many embodiments, the electromechanical coupling coefficient, k, for the disclosed material may be varied between about 0 and 1 (in either the longitudinal or transverse directions). In many embodiments, the electromechanical coupling coefficient in the transverse direction may vary between 0 and 0.5.

High coupling coefficients require large piezoelectric coefficients and low elastic moduli. For some embodiments, increasing the amount of yttrium in the system increases the piezoelectric and coupling coefficients but softens the system elastically. For some embodiments, the two coupling coefficients exhibit similar trends, with larger values achieved for higher yttrium concentrations. In some embodiments, greater values of k may be achieved using equiatomic Y:B alloys. In some embodiments, simultaneous enhancement of both $e_{33}$ and $C_{33}$, relative to unalloyed AlN, may be achieved where boron level are varied between about 0 and 25%. Disclosed herein are methods for co-alloying AlN with different species to aid in enhancing both the piezoelectric material and the elastic properties of a parent wurtzite structure.

EXAMPLES

Example 1

Materials and Methods

Figure 2A:
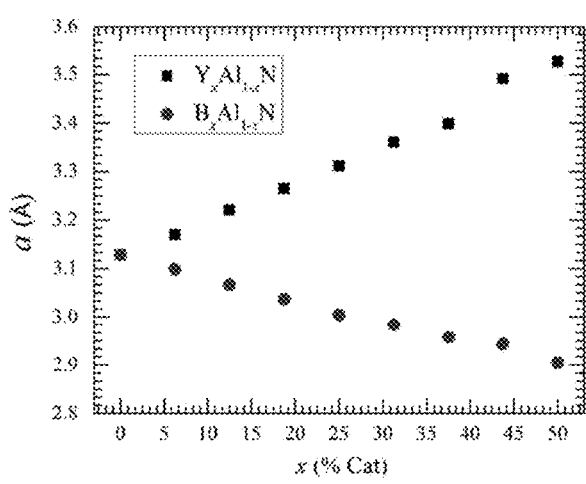
FIG. 2(a) is an illustration of the change in the lattice constant in a wurtzite crystal along the crystallographic a-axis as a function of yttrium and boron concentrations, according to some embodiments.
Figure 2B:
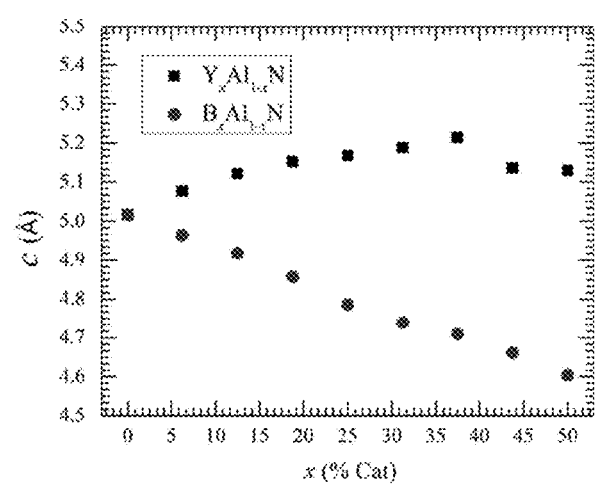
FIG. 2(b) is an illustration of the change in the lattice constant in a wurtzite crystal along the crystallographic c-axis as a function of yttrium and boron concentrations, according to some embodiments.
Figure 3:
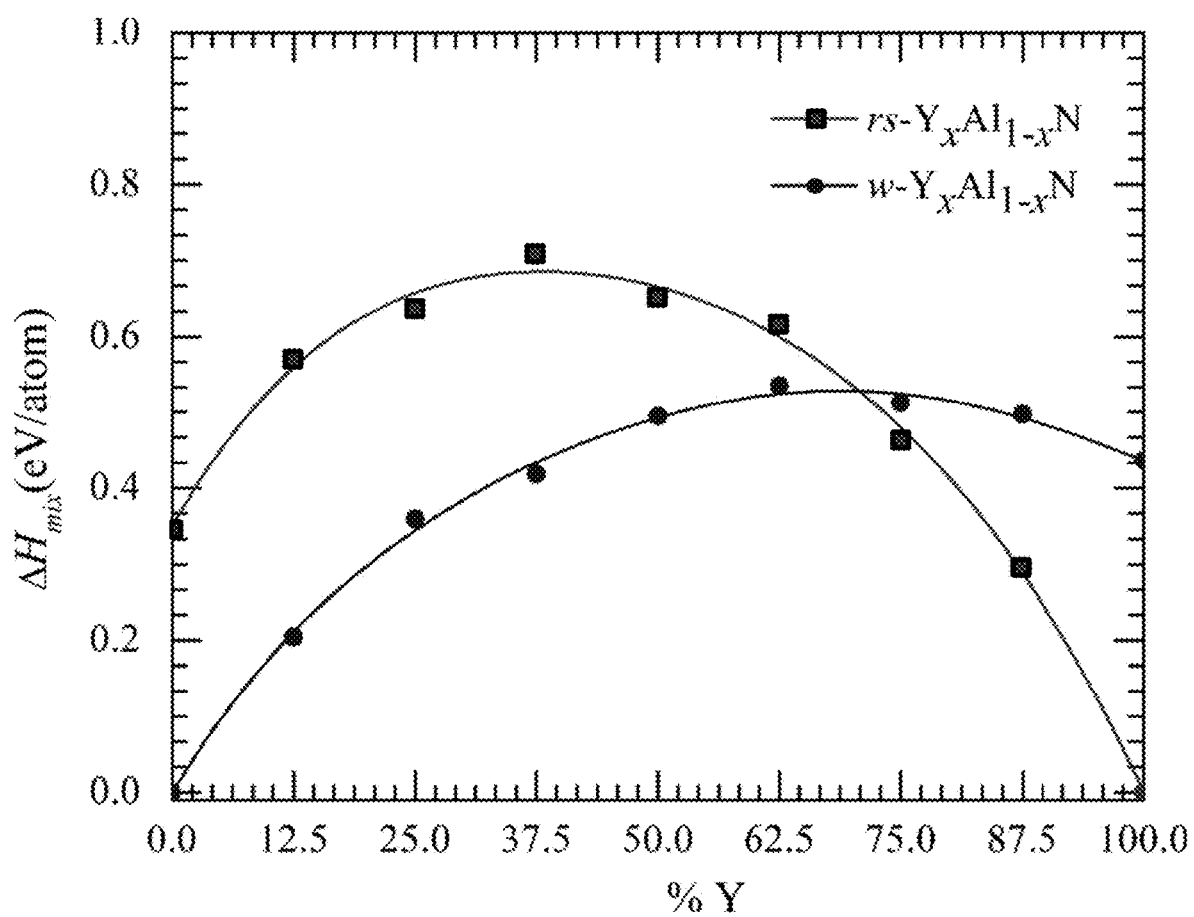
FIG. 3 is an illustration of the mixing enthalpies for wurtzite and rock salt crystal structures for AlN base crystals as a function of yttrium concentration, according to some embodiments.
Figure 4A:
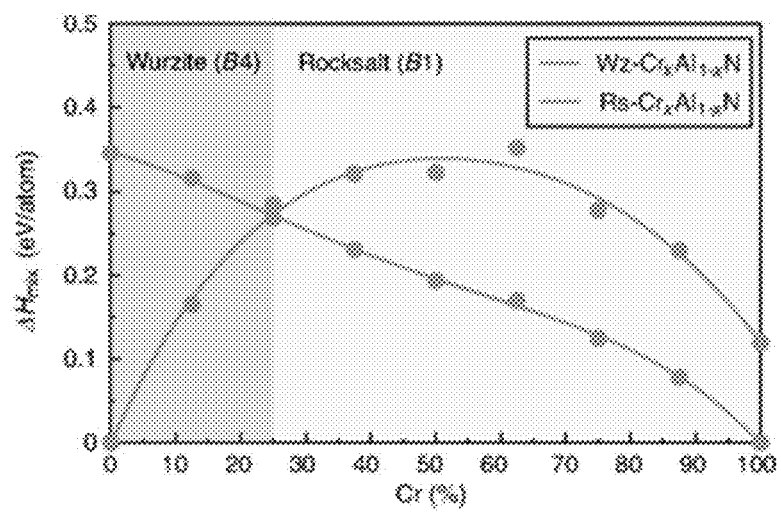
FIG. 4(a) is an illustration of the calculated mixing enthalpies for wurtzite and rock salt crystal structures for AlN base crystals as a function of chromium concentration, according to some embodiments.
Figure 4B:
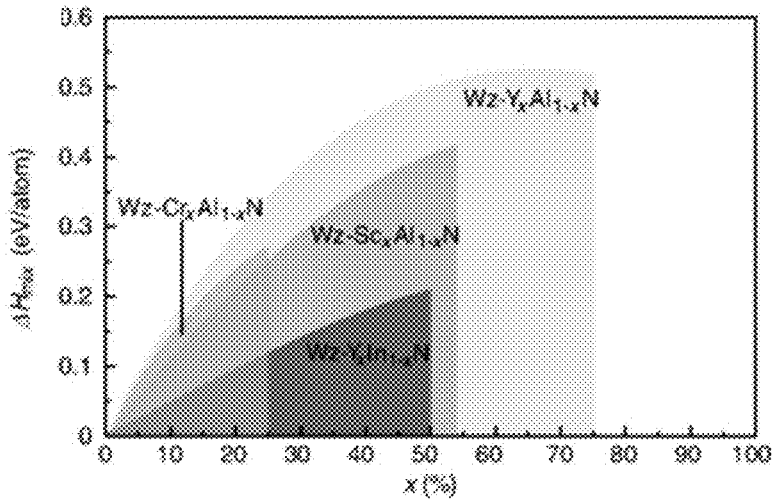
FIG. 4(b) is an illustration of the calculated mixing enthalpies for wurtzite and rock salt crystal structures; for AlN base crystals as a function of chromium, scandium, and yttrium concentration; and for InN base crystals as a function of yttrium concentration; according to some embodiments

To assess the changes in elastic and piezoelectric properties driven by different levels of YN and BN in $Al_{1-x-y}Y_xB_yN$ alloys, DFT relaxations of atomic positions and lattice constants was performed using the VASP package, with projector augmented waves in the generalized gradient approximation (GGA) using the Perdew-Burke-Ernzerhof exchange-correlation functional. An on-site Coulomb interaction (parameter U=3 eV) was introduced for the yttrium 3 d states. The parent structure is wurtzite AlN, in which Al is substituted with Y and B in the desired amounts. Supercells with 32 atoms are simulated using special quasirandom structures (SQS) (FIG. 1), whose pair correlation functions are the same as those of random alloys up to second-nearest neighbors. A plane wave cutoff energy of 500 eV was used; the energy tolerance stopping criteria were $10^{-8}$ and $10^{-7}$ for the electronic and ionic convergence, respectively. A 5×5×3 Monkhorst-Pack k-point mesh was used to sample the Brillouin zone, resulting in 38 irreducible k-points. The SQS supercells have been relaxed to obtain equilibrium lattice constants for all compositions studied. Due to the variability of atomic-scale environments in the SQS supercells, we performed five calculations at each composition and used them to average the properties, including the lattice constants. For the separate alloying only with YN or BN, the lattice constants a and c are plotted in FIG. 2 as a function of the dopant cation concentration: alloying with YN increases the lattice constants, while alloying with BN alone decrease them: these trends are simply due to the larger (smaller) cation radius of Y (B) compared to that of Al in AlN. Our DFT calculations of mixing enthalpies for alloy wurtzite and rocksalt phases of AlN—YN revealed that YN is miscible in AlN up to approximately 72-75% YN concentration, above which the wurtzite phase becomes unstable towards rocksalt structure formation (FIG. 3). Additionally, our DFT calculations and experimental results for alloy AlN—CrN showed that CrN is miscible up to approximately 25% concentration; AlN—ScN showed that ScN is miscible up to approximately 54% concentration; and InN—YN showed that YN is miscible up to approximately 50% concentration; respectively, above which wurtzite becomes unstable toward a rocksalt structure formation (FIG. 4a-4b).

Results and Discussion

Figure 5:
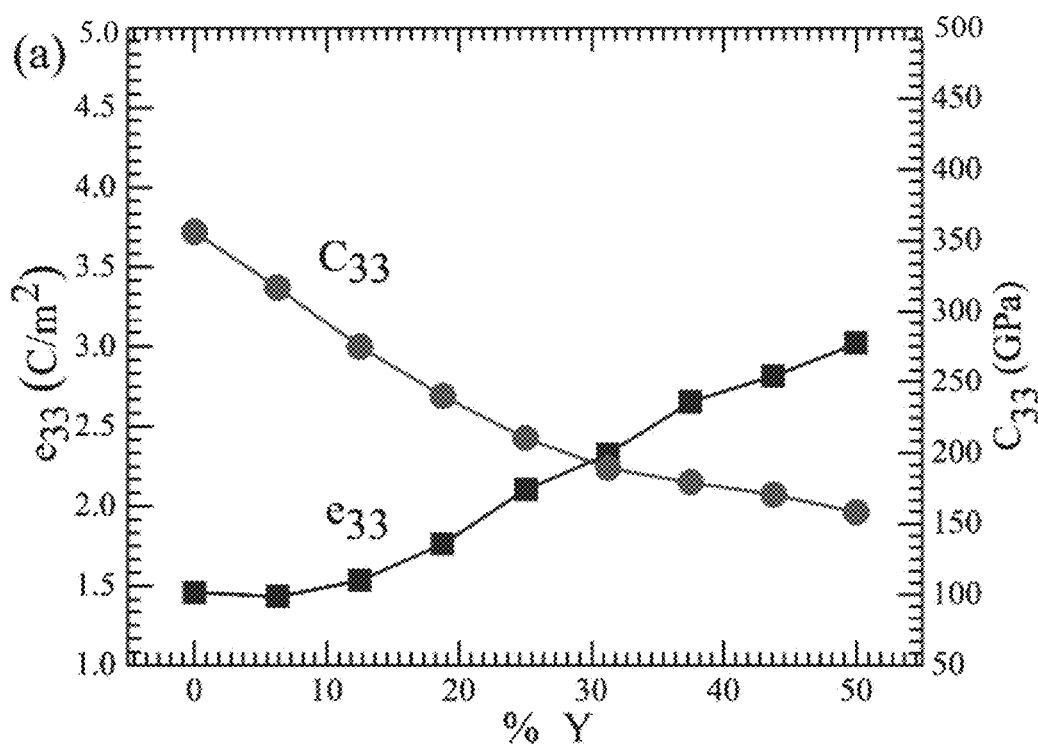
FIG. 5(a) is an illustration of the piezoelectric charge coefficient and elastic modulus of a wurtzite crystal as a function of yttrium concentration, according to some embodiments.
FIG. 5(b) is an illustration of the piezoelectric charge coefficient and elastic modulus of a wurtzite crystal as a function of boron concentration, according to some embodiments.
Figure 5:
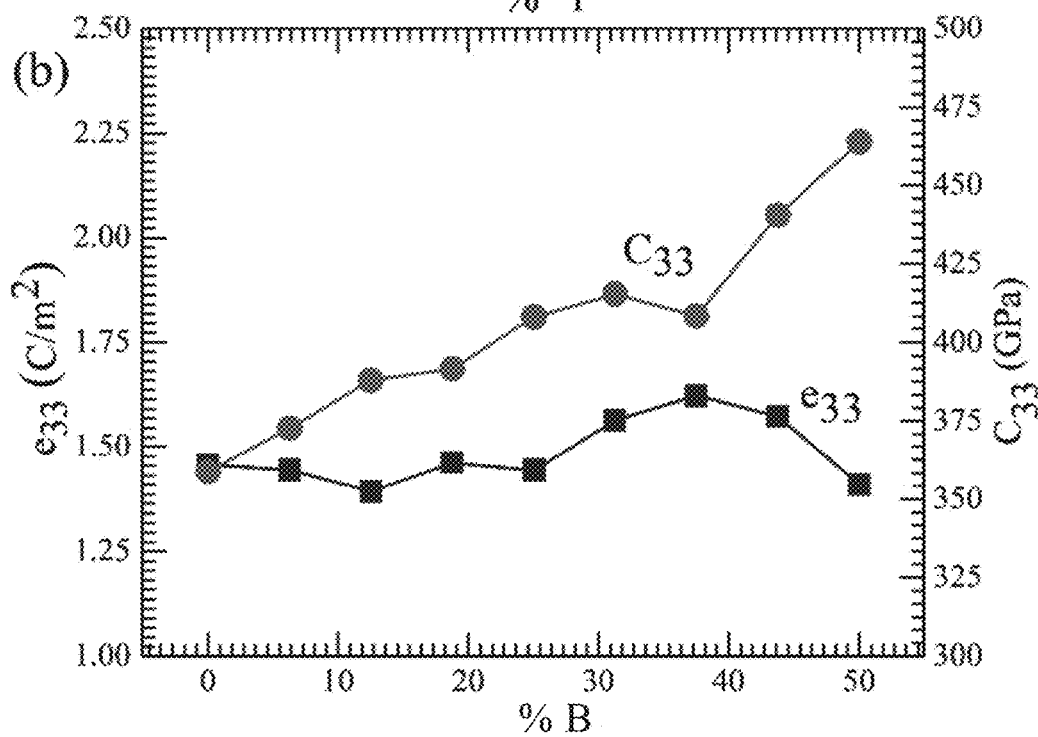
Figure 6:
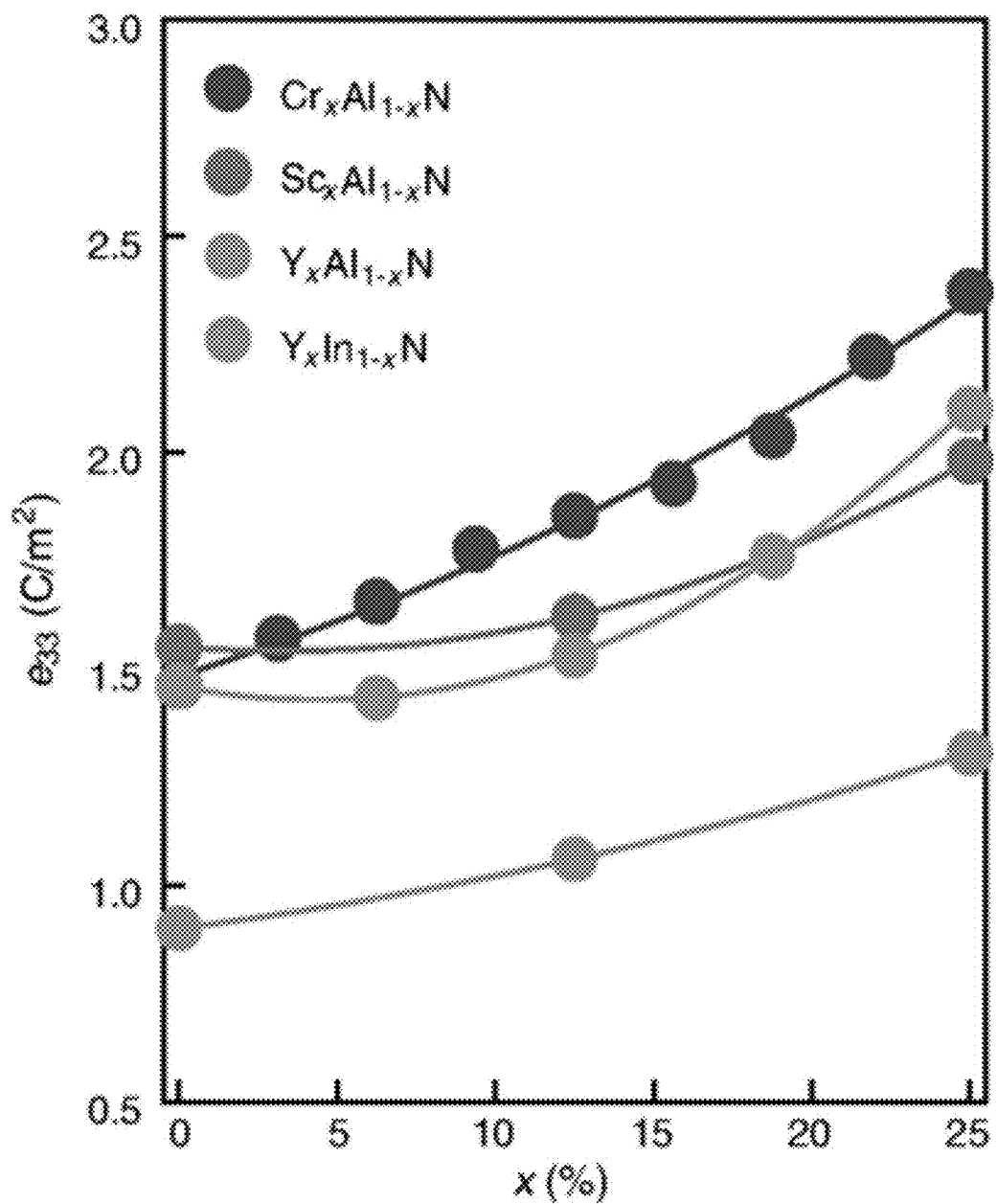
FIG. 6 is an illustration of the piezoelectric coefficient $e_{33}$ in for various concentrations of yttrium, scandium, and chromium in an AlN base crystal, and for yttrium in an InN base crystal, respectively, plotted for concentrations of up to 25%.

Focusing now on describing the piezoelectric properties of the alloys, we note that the piezoelectric charge coefficient $e_{33}$ is evaluated at each Y (x) and B (y) composition via Equation (1) below where $e_{33}^{clamped-ion}$ is the clamped ion contribution to $e_{33}$, e is the electron charge, Z* is the axial component of the dynamical Born effective charge tensor, $a_0$ is the equilibrium lattice constant, and $du/d\varepsilon$ is the sensitivity of the internal parameter u to strains along the crystallographic c-axis. The elastic constants were computed by finite differences between the energies of the lattices subjected to small applied strains. FIG. 5 shows the effects of separate BN and YN alloying on the properties of AlN. As seen in FIG. 5(a) the piezoelectric coefficient $e_{33}$ increases with Y concentration up to 50%, while the elastic constant $C_{33}$ decreases; this is consistent with previous works on the similar AlN—ScN system. FIG. 6 shows the effects on the piezoelectric coefficient $e_{33}$ of alloying AlN with concentrations of chromium, scandium, and yttrium, and the effects of alloying InN with yttrium, up to concentrations of 25%. In all cases, $e_{33}$ increases with increasing alloy concentration for the range shown. The physical origin of this effect arises from the larger radius of the Y ion, which changes the internal parameter u of the alloyed wurtzite structure and its sensitivity to strain, $u/d\varepsilon$ (refer to Eq. (1)). The value of $e_{33}$ that can be achieved by alloying with 50% Y is doubled compared to that of pure AlN (FIG. 5). FIG. 5(b) shows that alloying with BN alone increases the elastic modulus, which is consistent to another report. Interestingly, we also note that substituting B for Al does not alter the piezoelectric coefficient significantly up to concentrations of 50% B.

$$e_{33} = e_{33}^{clamped-ion} + \frac{4eZ^*}{\sqrt{3} a_0^2} \frac{du}{d\varepsilon} \quad (1)$$

Figure 7A:
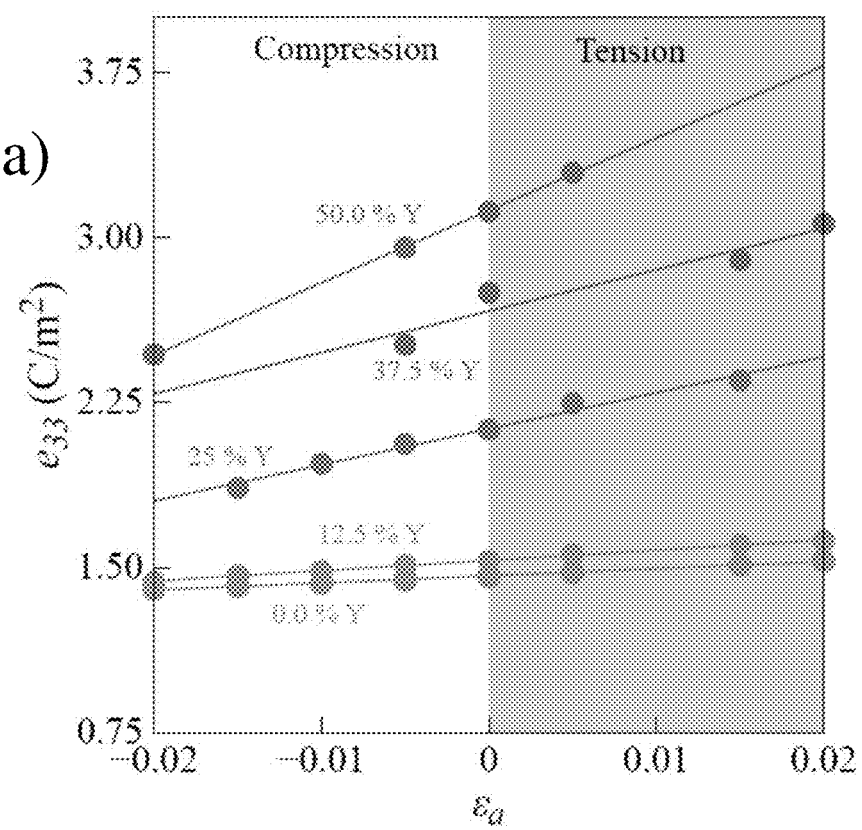
FIG. 7(a) is an illustration of the variation of the piezoelectric coefficient in an $Al_{1-x}Y_xN$ lattice with strain applied along the crystallographic a-axis, according to some embodiments.
Figure 7B:
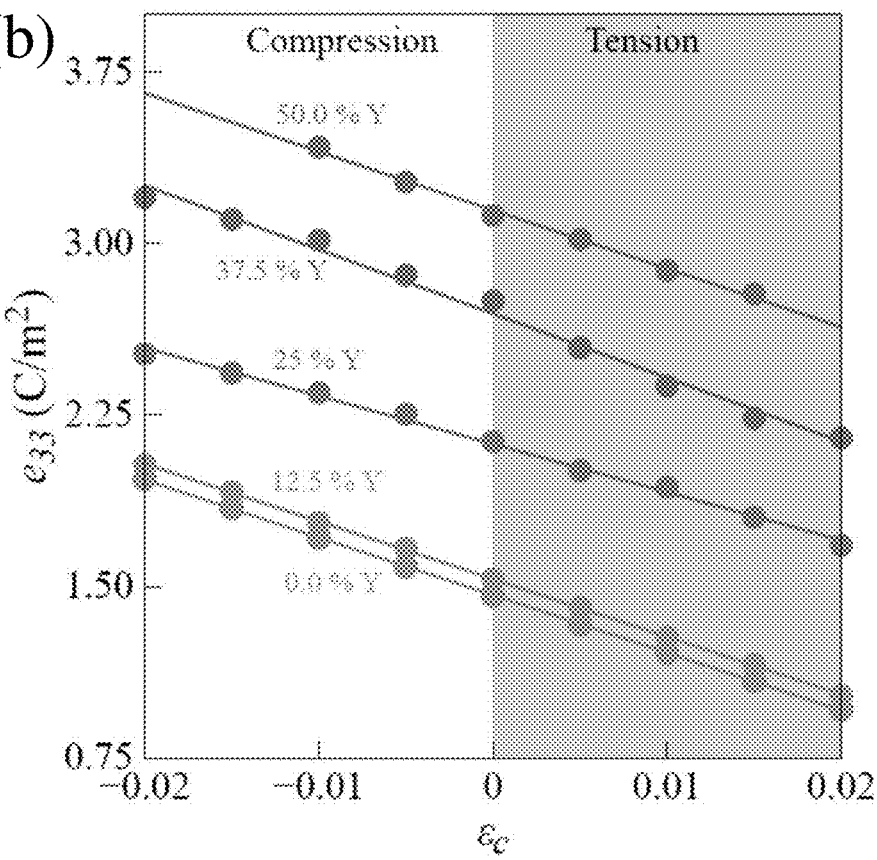
FIG. 7(b) is an illustration of the variation of the piezoelectric coefficient in an $Al_{1-x}Y_xN$ lattice with strain applied along the crystallographic c-axis, according to some embodiments.

When AlN—YN films are deposited, there is usually strain in the lattice stemming from the mismatch with the substrate, changing film texture with alloy concentration, or from insufficient annealing. It is therefore relevant to assess what the effect of this strain is on the piezoelectric coefficient, so we have redone the DFT calculations for the situations were strain is applied in plane (along the a and b directions) or out of plane (along the c direction); the results of these calculations are displayed in FIG. 7, which shows that $e_{33}$ can increase up to about 3.75 C/m² (i.e., 2.5 times that of pure AlN) either by alloying with 50% Y and applying 2% tension along the a axis (FIG. 7(a)), or by alloying with 50% Y and applying 2% compression along the c axis (FIG. 7(b)). The opposite trends of $e_{33}$ with strain along different directions (FIG. 7) suggest that, for homogeneous and isotropic strain in the AlN—YN lattice, the effects of strain along c and a directions may cancel each other at least partially and thus not affect the piezoelectric coefficient significantly. This is important when alloying with a secondary species, such as BN, which would amount to roughly isotropic strain when B is (nearly) homogenously doped throughout the AlN—YN lattice.

Figure 10A:
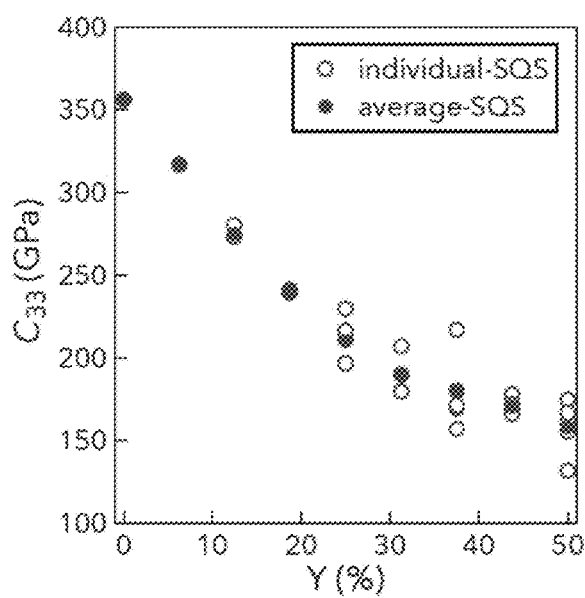
FIG. 10(a) is an illustration of the calculated $C_{33}$, for each individual SQS and averaged, at each concentration of yttrium.
Figure 10B:
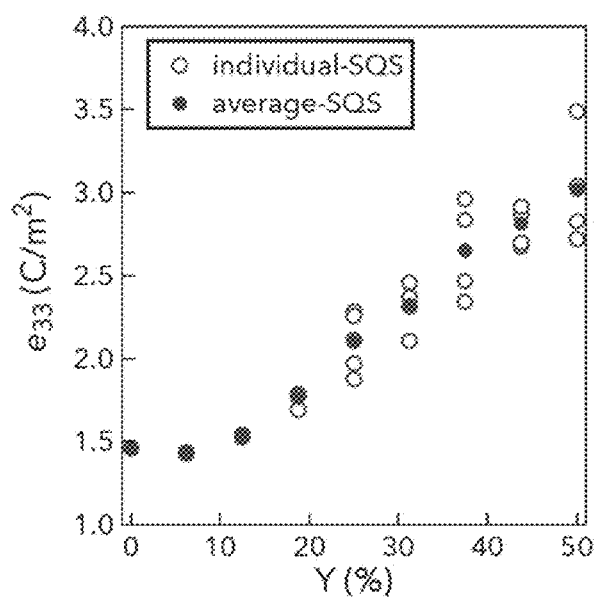
FIG. 10(b) is an illustration of the calculated $e_{33}$, for each individual SQS and averaged, at each concentration of yttrium.

Based on these results, we have set out to analyze how co-alloying with both YN and BN changes properties, towards finding composition regimes where the piezoelectric coefficient increases while the elastic modulus does not decrease to the same extent as in the case of alloying with Y alone. FIG. 7 shows the variation of $e_{33}$ and $C_{33}$ with the Y concentration x, at a fixed level of B doping, y (such that $x+y \leq 50\%$). The data points in FIG. 8 represent averages over SQS configurations. Other properties (i.e., $e_{31}$ and $C_{11}$) are shown as functions of x and y in FIG. 10(a)-10(b).

Our starting premise that the presence of boron can mitigate or control the decrease in elastic modulus $C_{33}$ brought about by Y alloying while still retaining some increase of the piezoelectric coefficient is borne out by the results in FIG. 8. For example, going from 0% B in $Al_{50}Y_{50}N$ to 18.75% B concentration in $Al_{50}Y_{31.25}B_{18.75}N$ results in a ~50 GPa increase of the elastic constant $C_{33}$ with ~33% decrease in the piezoelectric coefficient. For ease of reference, some of the results shown in FIG. 8 are also tabulated in Table I. BN alloying has a strong effect on mechanical properties, which can also be seen in Table I: increasing BN content from 31.25% to 50% at the expense of YN concentration nearly doubles the elastic modulus (from 238 GPa to 470 GPa).

TABLE I

Comparison between the properties of some of the Al—Y—B nitrides computed in this work and those of three commercial piezoelectrics.

| Material | $\varepsilon_{33}$ (C/m²) | $C_{33}$ (GPa) | $d_{33}$ (pC/N) | $k_{33}^2$ |
|---|---|---|---|---|
| PZT-7A, Ref [26] | 9.50 | 131 | 153 | 0.67 |
| PZT-4, Ref. [26] | 13.84 | 113 | 225 | 0.35 |
| $K_{0.5}Na_{0.5}NbO_3$, Ref[27, 28] | 4.14 | 104 | 80, 130 | 0.51 |
| this work: | | | | |
| AlN | 1.46 | 353 | 5 | 0.12 |
| $Al_{50}Y_{50}N$ | 3.02 | 158 | 38 | 0.57 |
| $Al_{50}Y_{43.75}B_{6.25}N$ | 2.51 | 161 | 22 | 0.47 |
| $Al_{50}Y_{37.50}B_{12.50}N$ | 1.70 | 180 | 13 | 0.27 |
| $Al_{50}Y_{31.25}B_{18.75}N$ | 1.85 | 209 | 13 | 0.27 |
| $Al_{50}Y_{25}B_{25}N$ | 1.58 | 223 | 13 | 0.20 |
| $Al_{50}Y_{18.75}B_{31.25}N$ | 1.93 | 238 | 13 | 0.26 |
| $Al_{50}Y_{12.5}B_{37.50}N$ | 1.54 | 253 | 9 | 0.17 |
| $Al_{50}Y_{6.25}B_{43.75}N$ | 1.73 | 328 | 8 | 0.17 |
| $Al_{50}B_{50}N$ | 1.34 | 470 | 3 | 0.08 |

Figure 9A:
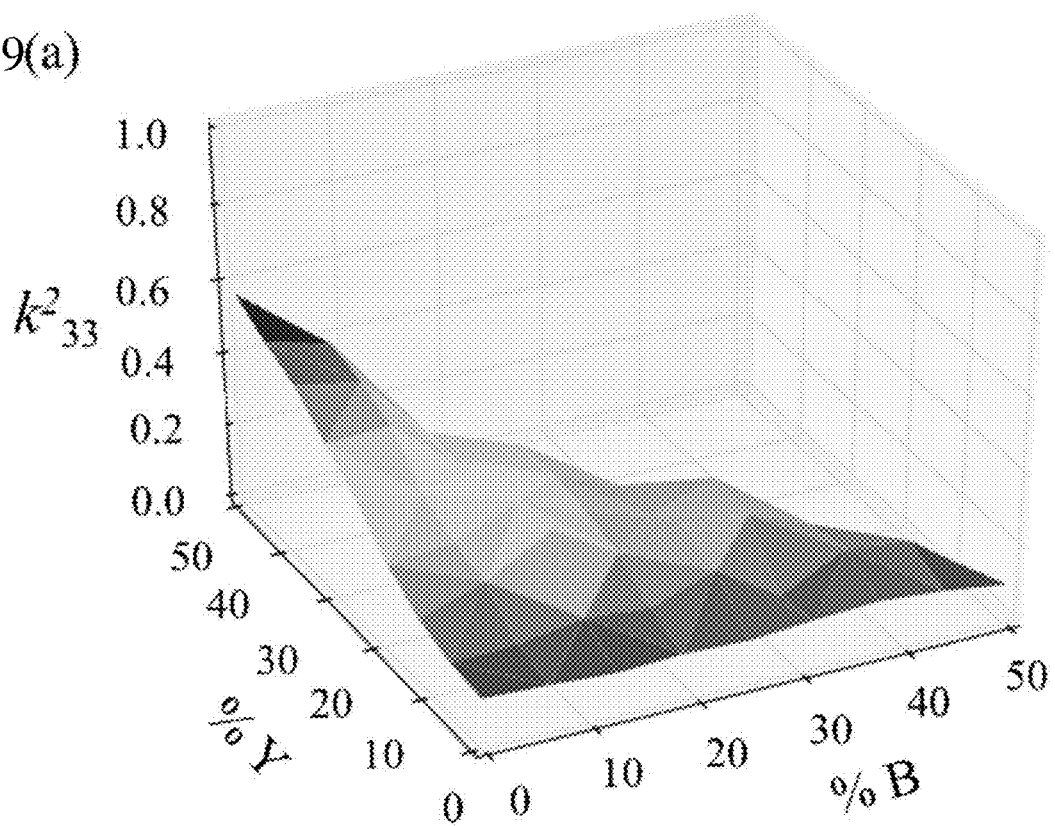
FIG. 9(a) is an illustration of the electromechanical coupling coefficient of a wurtzite material in a longitudinal ("33") direction, as a function of yttrium and boron concentrations, according to some embodiments.
Figure 9B:
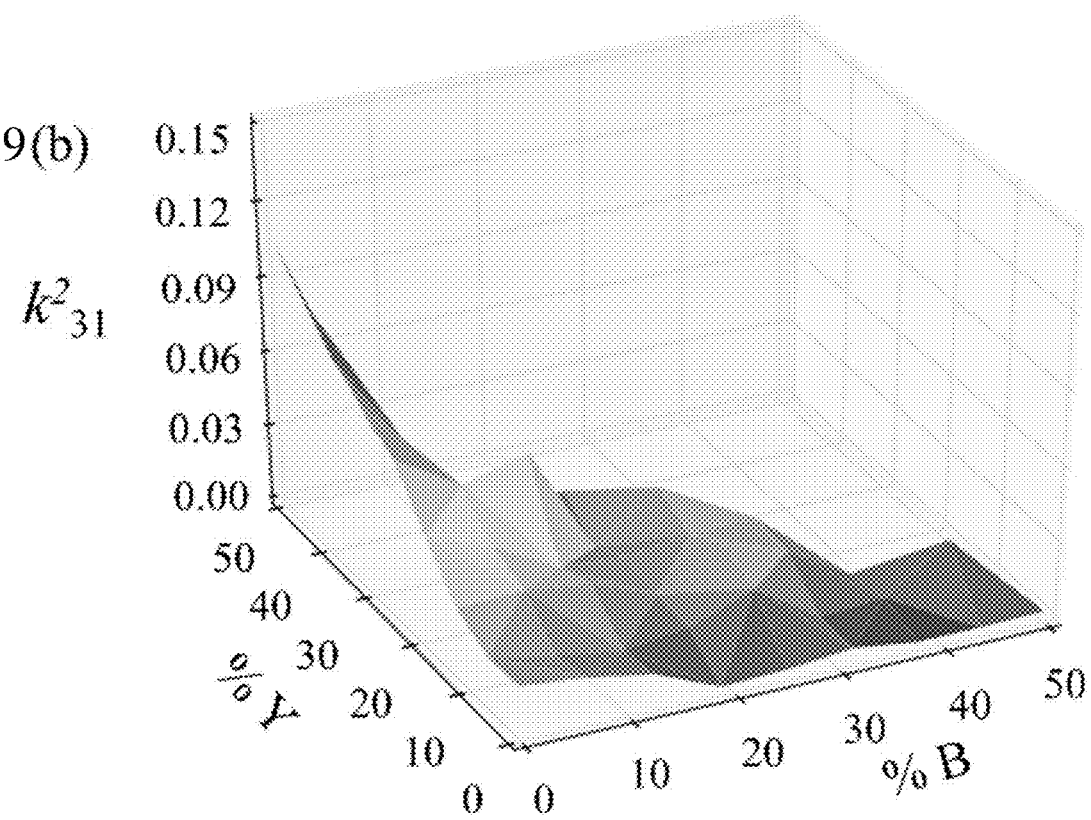
FIG. 9(b) is an illustration of the electromechanical coupling coefficient of a wurtzite material in a transverse ("31") direction, as a function of yttrium and boron concentrations, according to some embodiments.

Next, we discuss the electromechanical coupling coefficients resulting from co-alloying of AlN with YN and BN. These coefficients are parameters in designing transducers for energy harvesting and sensing applications. Applications such as pressure sensors, accelerometers, and gyroscopes commonly require the piezoelectric medium to operate in the longitudinal length mode, for which the relevant coupling coefficient is $$k_{33}^2 = \frac{e_{33}^2}{\varepsilon_{33}C_{33} + e_{33}^2}$$

where $\varepsilon_{33}$ is the 33 component of the dielectric tensor. The static dielectric constants vary by about 10%, approximately, from their value at x=12.5% (see, e.g., FIG. 11(a)-11(h)) for the entire range of equimolar Y—B doping (i.e., x≤25% in $Al_{1-2x}Y_xB_xN$), so a constant value of $\varepsilon_{33}$=5.0 was assumed in computing the coupling coefficients. High $k_{33}^2$ coupling factor corresponds to transducers with better axial resolution, broader bandwidth, and higher sensitivity. Actuators based on cantilevers operate in the transverse length mode (bending), for which the relevant coupling coefficient is $$k_{31}^2 = \frac{e_{31}^2}{\varepsilon_{ee}C_{13} + e_{31}^2},$$

where $e_{31}$ and $C_{11}$ are components of the piezoelectric and elastic tensor, respectively. The two coupling coefficients are plotted in FIG. 9(a,b), for the range of Y and B concentrations considered. High coupling constants require large piezoelectric coefficients and low elastic moduli. Increasing the amount of Y in the system increases the piezoelectric and coupling coefficients but softens the system elastically, which is true for both coupling modes addressed here.

Figure 12A:
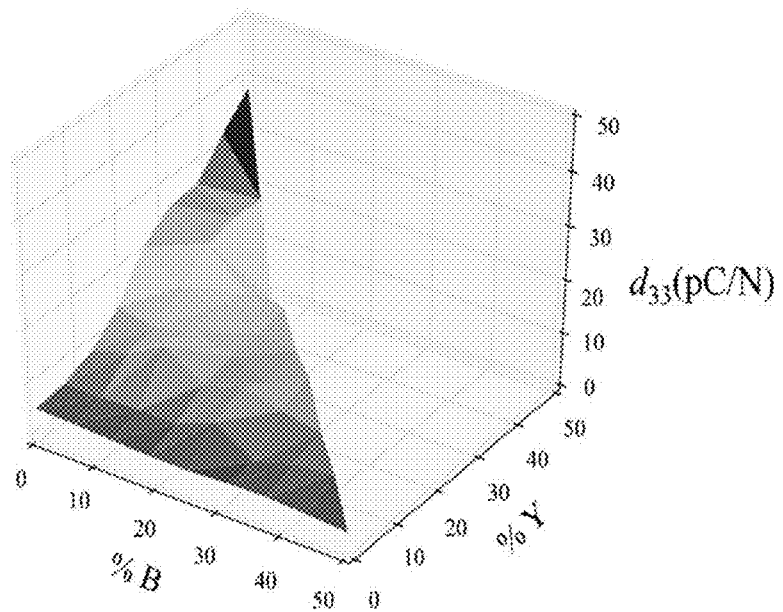
FIG. 12(a) is a calculated $d_{33}$ surface in yttrium-boron composition space, according to some embodiments.
Figure 12B:
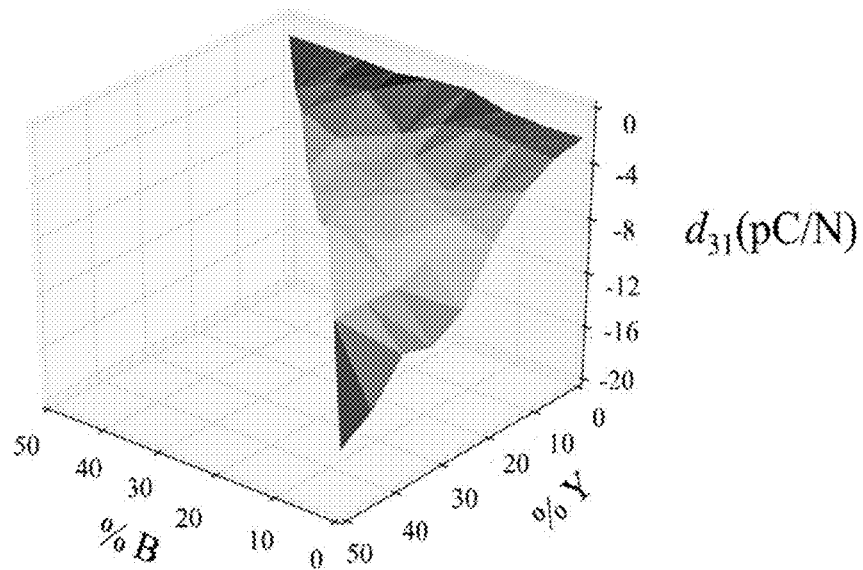
FIG. 12(b) is a calculated $d_{31}$ surface in yttrium-boron composition space, according to some embodiments.

The two coupling coefficients exhibit similar trends (FIG. 9), with larger values achieved for higher Y concentrations. However, variations of $k_{31}^2$ are significantly smaller, and larger values can also be achieved using equiatomic Y:B alloys. With the piezoelectric and elastic tensor components obtained from DFT calculations, it is useful to compare some of the properties of the co-alloyed AlN system with those of known piezoelectrics. Table I, which also includes the longitudinal piezoelectric modulus $d_{33}$, shows the properties of three well-known piezoelectrics in comparison with a few selected alloy compositions computed here (for completeness, piezoelectric moduli are also plotted in FIG. 12(a)-12(b) for the entire range of compositions used). Direct inspection shows that AlN co-alloyed with Y and B can achieve parameters comparable to those of commercial piezoelectrics. Additionally, the simultaneous enhancement of $e_{33}$ and $C_{33}$ in comparison to the pure AlN values can be seen for boron levels of up 25%, illustrating that co-alloying with different species represents a valuable route for simultaneously engineering the piezoelectric and the elastic properties of a parent wurtzite structure such as that of AlN.

In conclusion, we have shown that co-alloying of AlN with YN and BN leads to superior control of both piezoelectric and mechanical properties. The idea of introducing BN into the systems arose as a way to stiffen the material, which otherwise becomes increasingly softer with increased YN content. In the process of assessing the influence of BN and YN composition on properties, we have separately calculated the effect of straining the lattice in different directions, and found that enhancements of the piezoelectric coefficient can be made by applied strain as well: this strain effect could become be a factor for substrates with significant mismatch strain, or for electromechanical applications where strain develops in the structure during operation.

The results presented here could carry over to other parent phases and alloying phases as well, provided that each alloying agent offers a clear advantage in terms of engineering one specific property. In our case, YN leads to increasing the piezoelectric coefficient and BN leads to increasing the stiffness. The use of both YN and BN offers intrinsic, simultaneous control over the mechanical and piezoelectric properties of the Al—Y—B—N system, even though the maximal value for each individual parameter can be achieved in the presence of one dopant.

REFERENCES

S. H. Park, H. B. Lee, S. M. Yeon, J. Park and N. K. Lee, *Flexible and Stretchable Piezoelectric Sensor with Thickness-Tunable Configuration of Electrospun Nanofiber Mat and Elastomeric Substrates*, ACS Applied Materials & Interfaces 8, 24773-24781 (2016).

C. Pang, G.-Y. Lee, T.-i. Kim, S. M. Kim, H. N. Kim, S.-H. Ahn and K.-Y. Suh, A *Flexible* and *Highly Sensitive* Strain-*Gauge Sensor Using Reversible Interlocking of Nanofibres*, Nature materials 11, 795-801 (2012).

J. A. Rogers, T. Someya and Y. Huang, *Materials and Mechanics for Stretchable Electronics*, Science 327, 1603-1607 (2010).

K. Uchino, *Materials Issues in Design and Performance of Piezoelectric Actuators: An Overview*, Acta Materialia 46, 3745-3753 (1998).

S. Trolier-McKinstry and P. Muralt, *Thin Film Piezoelectrics for Mems*, Journal of Electroceramics 12, 7-17 (2004).

F. Tasnádi, B. Alling, C. Höglund, G. Wingqvist, J. Birch, L. Hultman and I. A. Abrikosov, *Origin of the Anomalous Piezoelectric Response in Wurtzite Sc X Al 1–X N Alloys*, Physical review letters 104, 137601 (2010).

S.-B. Kim, H. Park, S.-H. Kim, H. C. Wikle, J.-H. Park and D.-J. Kim, Comparison of *Mems Pzt Cantilevers Based on $ D_{31} $ and $ D_{33} $ Modes for Vibration Energy Harvesting*, Journal of microelectromechanical systems 22, 26-33 (2013).

M. A. Caro, S. Zhang, T. Riekkinen, M. Ylilammi, M. A. Moram, O. Lopez-Acevedo, J. Molarius and T. Laurila, *Piezoelectric Coefficients and Spontaneous Polarization of Scaln*, Journal of Physics: Condensed Matter 27, 245901 (2015).

P. Mayrhofer, H. Riedl, H. Euchner, M. Stöger-Pollach, P. Mayrhofer, A. Bittner and U. Schmid, *Microstructure and Piezoelectric Response of Yxal 1–Xn Thin Films*, Acta Materialia 100, 81-89 (2015).

C. Tholander, J. Birch, F. Tasnádi, L. Hultman, J. Palisaitis, P. Å. Persson, P. Jensen, P. Sandström, B. Alling and A. ukauskaite, *Ab Initio Calculations and Experimental Study of Piezoelectric Y X in 1–X N Thin Films Deposited Using Reactive Magnetron Sputter Epitaxy*, Acta Materialia 105, 199-206 (2016).

M. Akiyama, T. Kamohara, K. Kano, A. Teshigahara, Y. Takeuchi and N. Kawahara, *Enhancement of Piezoelectric Response in Scandium Aluminum Nitride Alloy Thin Films Prepared by Dual Reactive Cosputtering*, Advanced Materials 21, 593-596 (2009).

A. Zukauskaite, C. Tholander, J. Palisaitis, P. O. A. Persson, V. Darakchieva, N. Ben Sedrine, F. Tasnadi, B. Alling, J.

Birch and L. Hultman, *Yxal1–Xn Thin Films*, Journal of Physics D-Applied Physics 45 (2012). 10.1088/0022-3727/45/42/422001

G. Piazza, V. Felmetsger, P. Muralt, R. H. Olsson III and R. Ruby, *Piezoelectric Aluminum Nitride Thin Films for Microelectromechanical Systems*, MRS bulletin 37, 1051-1061 (2012).

Y. Zhang, W. Zhu, D. Zhou, Y. Yang and C. Yang, *Effects of Sputtering Atmosphere on the Properties of C-Plane Scaln Thin Films Prepared on Sapphire Substrate*, Journal of Materials Science: Materials in Electronics 26, 472-478 (2015).

R. R. Syms, H. Zou and P. Boyle, *Mechanical Stability of a Latching Mems Variable Optical Attenuator*, Journal of microelectromechanical systems 14, 529-538 (2005).

C. Tholander, I. A. Abrikosov, L. Hultman and F. Tasnadi, *Volume Matching Condition to Establish the Enhanced Piezoelectricity in Ternary (Sc,Y)(0.5)(Al,Ga,in)(0.5)N Alloys*, Physical Review B 87 (2013). 10.1103/PhysRevB.87.094107

G. Kresse and J. Furthmüller, *Efficiency of Ab-Initio Total Energy Calculations for Metals and Semiconductors Using a Plane-Wave Basis Set*, Computational Materials Science 6, 15-50 (1996).

J. P. Perdew, K. Burke and M. Ernzerhof, *Generalized Gradient Approximation Made Simple*, Physical review letters 77, 3865 (1996).

G. Kresse and D. Joubert, *From Ultrasoft Pseudopotentials to the Projector Augmented-Wave Method*, Physical Review B 59, 1758 (1999).

M. Barsukova, N. V. Izarova, R. N. Biboum, B. Keita, L. Nadjo, V. Ramachandran, N. S. Dalal, N. S. Antonova, J. J. Carbó and J. M. Poblet, *Polyoxopalladates Encapsulating Yttrium and Lanthanide Ions, [Xiiipdii12 (Asph) 8o32] 5-(X=Y, Pr, Nd, Sm, Eu, Gd, Tb, Dy, Ho, Er, Tm, Yb, Lu)*, Chemistry—A European Journal 16, 9076-9085 (2010).

A. Van de Walle, P. Tiwary, M. De Jong, D. Olmsted, M. Asta, A. Dick, D. Shin, Y. Wang, L.-Q. Chen and Z.-K. Liu, *Efficient Stochastic Generation of Special Quasirandom Structures*, Calphad 42, 13-18 (2013).

H. J. Monkhorst and J. D. Pack, *Special Points for Brillouin-Zone Integrations*, Physical Review B 13, 5188 (1976).

D. Vanderbilt, *Berry-Phase Theory of Proper Piezoelectric Response*, Journal of Physics and Chemistry of Solids 61, 147-151 (2000).

B. Narayanan, I. E. Reimanis, E. R. Fuller Jr and C. V. Ciobanu, *Elastic Constants of B-Eucryptite Studied by Density Functional Theory*, Physical Review B 81, 104106 (2010).

F. Tasnadi, I. A. Abrikosov and I. Katardjiev, *Significant Configurational Dependence of the Electromechanical Coupling Constant of B0.125al0.875n*, Applied Physics Letters 94 (2009). 10.1063/1.3119644

X. Yang, G. Zeng and W. Cao, *Analysis of Mechanical and Electrical Damages in Piezoelectric Ceramics*. (INTECH Open Access Publisher, 2010).

L. Egerton and D. M. Dillon, *Piezoelectric and Dielectric Properties of Ceramics in the System Potassium-Sodium Niobate*, Journal of the American Ceramic Society 42, 438-442 (1959).

D. Yang, L. Wei, X. Chao, Z. Yang and X. Zhou, *First-Principles Calculation of the Effects of Li-Doping on the Structure and Piezoelectricity of (K 0.5 Na 0.5) Nbo 3 Lead-Free Ceramics*, Physical Chemistry Chemical Physics 18, 7702-7706 (2016).

Q.-M. Wang, X.-H. Du, B. Xu and L. E. Cross, *Electromechanical Coupling and Output Efficiency of Piezoelectric Bending Actuators*, IEEE transactions on ultrasonics, ferroelectrics, and frequency control 46, 638-646 (1999).

M. Kim, J. Kim and W. Cao, *Aspect Ratio Dependence of Electromechanical Coupling Coefficient of Piezoelectric Resonators*, Applied Physics Letters 87, 132901 (2005).

G. Wingqvist, *Thin-Film Electro-Acoustic Sensors Based on AlN and Its Alloys: Possibilities and Limitations*, Microsystem technologies 18, 1213-1223 (2012).

K. Uchino, *Piezoelectric Ultrasonic Motors: Overview*, Smart materials and structures 7, 273 (1998).

H. Li and J. J. Vlassak, *Determining the Elastic Modulus and Hardness of an Ultrathin Film on a Substrate Using Nanoindentation*, J. Mater. Res., vol. 24, no. 3, pp. 1114-1126, 2009.

H. Y. Yu, S. C. Sanday, and B. B. Rath, *The effect of substrate on the elastic properties of films determined by the indentation test—axisymmetric boussinesq problem*, J. Mech. Phys. Solids, vol. 38, no. 6, pp. 745-764, 1990.

While multiple embodiments are disclosed, still other embodiments of the present invention will become apparent to those skilled in the art from the following detailed description. As will be apparent, the invention is capable of modifications in various obvious aspects, all without departing from the spirit and scope of the present invention. Accordingly, the detailed description is to be regarded as illustrative in nature and not restrictive.

All references disclosed herein, whether patent or non-patent, are hereby incorporated by reference as if each was included at its citation, in its entirety. In case of conflict between reference and specification, the present specification, including definitions, will control.

Although the present disclosure has been described with a certain degree of particularity, it is understood the disclosure has been made by way of example, and changes in detail or structure may be made without departing from the spirit of the disclosure as defined in the appended claims.

We claim:

1. A material having a piezoelectric property and a mechanical property, comprising:
    an indium nitride wurtzite crystal structure compound;
        a first alloying element, and
        a second alloying element.

2. The material of claim 1 wherein the first and second alloying elements are trivalent ions.

3. The material of claim 1 wherein the first alloying element is selected from the group consisting of chromium, scandium, and yttrium.

4. The material of claim 3 wherein the second alloying element is selected from the group consisting of boron, chromium, yttrium, and scandium.

5. The material of claim 1, wherein the first alloying element is yttrium and the second alloying element is boron.

6. The material of claim 3, wherein the first alloying element is in a concentration between 0 and 50%.

7. The material of claim 6, wherein the second alloying element is in a concentration between 0 and 50%.

8. A film comprising the material of claim 1.

9. A method of fabricating a material having a piezoelectric property, comprising:
    providing a wurtzite crystal structure compound;
    alloying the wurtzite crystal with a first alloying element; and
    alloying the wurtzite crystal with a second alloying element, wherein the wurtzite crystal structure compound comprises indium nitride.

10. The method of claim 9 wherein the first and second alloying elements are trivalent ions.

11. The method of claim 9 wherein the first alloying element is selected from the group consisting of chromium, scandium, and yttrium.

12. The method of claim 11 wherein the second alloying element is selected from the group consisting of boron, chromium, yttrium, and scandium.

13. The method of claim 11, wherein the first alloying element is yttrium.

14. The method of claim 13, wherein the second alloying element is boron.

15. The method of claim 14, wherein the first alloying element is in a concentration between 0 and 50% and the second alloying element is in a concentration between 0 and 50%.

16. The material of claim 1, wherein the first alloying element and the second alloying element are operative to simultaneously optimize the piezoelectric property and a mechanical property of the material.

17. The method of claim 9, further comprising simultaneously optimizing the piezo electric property and a mechanical property of the material using the first alloying element and the second alloying element.

18. The method of claim 9, wherein the piezoelectric property comprises a piezoelectric charge coefficient in the range of about −0.95-2.51 coulombs per square meter, and the material includes a mechanical property comprising an elastic modulus in the range of about 161-416 gigapascal.

19. The material of claim 1, wherein the material is fabricated by:
providing a wurtzite crystal structure compound;
alloying the wurtzite crystal with a first alloying element; and
alloying the wurtzite crystal with a second alloying element, wherein the wurtzite crystal structure compound comprises indium nitride.

20. The material of claim 1, wherein the piezoelectric property comprises a piezoelectric charge coefficient in the range of about −0.95-1.7 coulombs per square meter, and the mechanical property comprises an elastic modulus in the range of about 161-300 gigapascal.

* * * * *